United States Patent
Wang

(10) Patent No.: US 9,957,605 B2
(45) Date of Patent: May 1, 2018

(54) SUBSTRATE FIXING APPARATUS

(71) Applicants: BOE Technology Group Co., Ltd., Beijing (CN); Beijing BOE Display Technology Co., Ltd., Beijing (CN)

(72) Inventor: Hualong Wang, Beijing (CN)

(73) Assignees: BOE Technology Group Co., Ltd., Beijing (CN); Beijing BOE Display Technology Co., Ltd., Beijing (CN)

(*) Notice: Subject to any disclaimer, the term of this patent is extended or adjusted under 35 U.S.C. 154(b) by 213 days.

(21) Appl. No.: 14/801,483

(22) Filed: Jul. 16, 2015

(65) Prior Publication Data

US 2016/0281215 A1    Sep. 29, 2016

(30) Foreign Application Priority Data

Mar. 27, 2015 (CN) .......................... 2015 1 0142563

(51) Int. Cl.
*C23C 14/00* (2006.01)
*C23C 14/50* (2006.01)

(52) U.S. Cl.
CPC ................................... *C23C 14/50* (2013.01)

(58) Field of Classification Search
CPC ........................................................ C23C 14/50
See application file for complete search history.

(56) References Cited

U.S. PATENT DOCUMENTS

| 4,897,171 A * | 1/1990 | Ohmi ................. H01L 21/6831 118/500 |
| 6,227,372 B1 | 5/2001 | Thomas et al. |
| 2006/0006095 A1 | 1/2006 | White |
| 2007/0049033 A1* | 3/2007 | Lee ..................... C23C 14/042 438/692 |

FOREIGN PATENT DOCUMENTS

| CN | 201567369 U | 9/2010 |
| CN | 102629567 A | 8/2012 |
| CN | 102859678 A | 1/2013 |
| CN | 102912310 A | 2/2013 |
| CN | 203807551 U | 9/2014 |
| CN | 204079778 U | 1/2015 |
| CN | 204189776 U | 3/2015 |

OTHER PUBLICATIONS

Sep. 18, 2016—(CN)—First Office Action Appn 201510142563.9 with English Tran.

* cited by examiner

*Primary Examiner* — Timon Wanga
(74) *Attorney, Agent, or Firm* — Banner & Witcoff, Ltd.

(57) ABSTRACT

A substrate fixing apparatus includes a metal frame body. A central portion of the metal frame body is provided with a through hole; a recess configured for bearing a substrate is formed on the metal frame body along an edge of the through hole; the recess is recessed towards an inside of the metal frame body along a thickness direction of the metal frame body; and a first insulating pad is disposed at the bottom of the recess.

10 Claims, 2 Drawing Sheets

US 9,957,605 B2

SUBSTRATE FIXING APPARATUS

This application claims priority to Chinese Patent Application No. 201510142563.9, filed Mar. 27, 2015. The present application claims priority to and the benefit of the above-identified application and is incorporated herein in its entirety.

TECHNICAL FIELD

The embodiment of the present disclosure relates to a display substrate fixing apparatus.

BACKGROUND

Currently, in the process of manufacturing a display substrate, e.g., a color filter (CF) substrate, when an indium tin oxide (ITO) film is coated/deposited on the display substrate, due to the requirement of a sputter coating device, the display substrate must be vertically hung on/over a metal frame and sent into the sputter coating device, and hence the coating process can be conducted.

SUMMARY

At least one embodiment of the present disclosure provides a substrate fixing apparatus, which can avoid the abnormal discharge phenomenon due to the conduction between a substrate and a metal frame in the coating process and hence improve coating effect.

At least one embodiment of the present disclosure provides a substrate fixing apparatus, which comprises a metal frame body. A central portion of the metal frame body is provided with a through hole; a recess configured for bearing a substrate is formed on the metal frame body along an edge of the through hole; the recess is recessed towards an inside of the metal frame body along a thickness direction of the metal frame body; and a first insulating pad is disposed at the bottom of the recess.

At least one embodiment of the present disclosure provides a vertical coating device, which comprises any foregoing substrate fixing apparatus used with the vertical coating device.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

Simple description will be given below to the accompanying drawings of the embodiments to provide a more clear understanding of the technical proposals of the embodiments of the present disclosure. Obviously, the drawings described below only involve some embodiments of the present disclosure but are not intended to limit the present disclosure.

DETAILED DESCRIPTION

For more clear understanding of the objectives, technical proposals and advantages of the embodiments of the present disclosure, clear and complete description will be given below to the technical proposals of the embodiments of the present disclosure with reference to the accompanying drawings of the embodiments of the present disclosure. Obviously, the preferred embodiments are only partial embodiments of the present disclosure but not all the embodiments. All the other embodiments obtained by those skilled in the art without creative efforts on the basis of the embodiments of the present disclosure illustrated shall fall within the scope of protection of the present disclosure.

During the manufacturing of a color filter substrate applied in, e.g., a liquid crystal display (LCD), the inventor of the application has found that: in the sputter coating process, the material for coating an ITO film tends to fall (e.g., be deposited) into gaps between the substrate in the process and the metal frame for bearing the substrate; due to the ITO film material falling into the gaps, the ITO film tends to be directly conducted with the metal frame in the sputter coating process; and hence the abnormal discharge phenomenon can be caused, and finally the coating effect can be disadvantageously affected.

Figure 1:
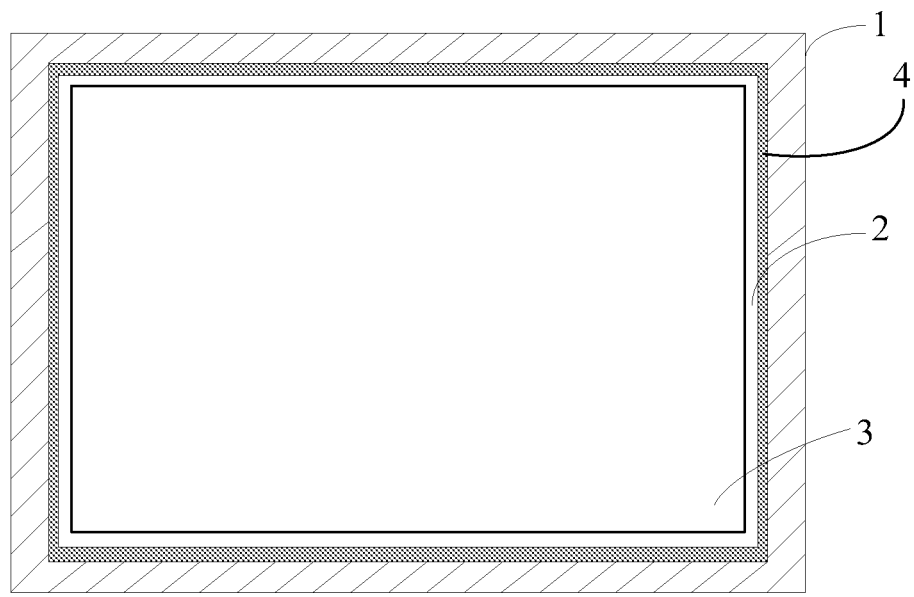
FIG. 1 is a schematic top view of a substrate fixing apparatus provided by an embodiment of the present disclosure.

FIG. 1 is a schematic top view of a substrate fixing apparatus provided by at least one embodiment of the present disclosure. As shown in FIG. 1, the substrate fixing apparatus comprises a metal frame body 1. A central portion of the metal frame body 1 is provided with a through hole 3 consistent with an area of a substrate, in which area for example an ITO film is to be deposited; a recess 2 for bearing the substrate is formed on the metal frame body 1 along the edge/periphery of the through hole 3; the recess 2 is recessed towards the inside of the metal frame body 1 along the thickness direction of the metal frame body 1; and a first insulating pad 4 is provided at the bottom of the recess 2 in a form of ring for example.

Figure 2A:
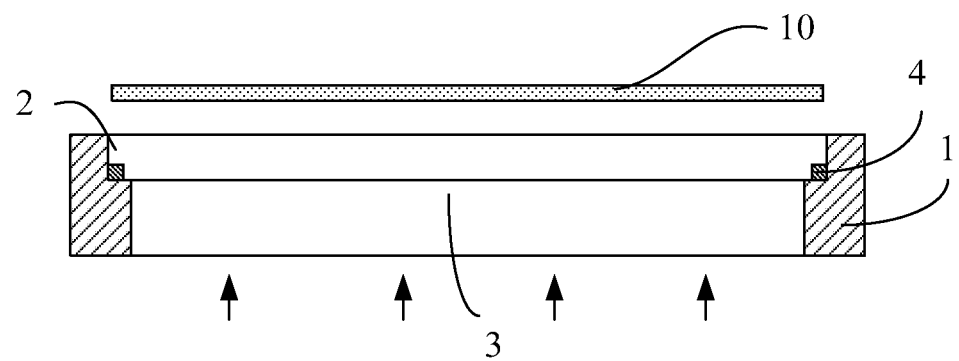
FIG. 2A is a schematic sectional view of one example of the substrate fixing apparatus provided by the embodiment.

FIG. 2A is a schematic sectional view of one example of the substrate fixing apparatus provided by the embodiment. In FIG. 2A, for the purpose of description, a substrate 10 (e.g., a glass substrate) to be coated with e.g., ITO is additionally arranged. As shown in the figure, in operation, the substrate 10 is disposed on one side of the metal frame body 1 provided with the recess 2 and an evaporation source (not shown) is disposed on the other side of the frame body 1. Therefore, an evaporation material is evaporated/sputtered on the substrate 10 as shown by the arrows. As illustrated in FIG. 2A, the recess 2 has a stepped shape at the edge of the through hole 3; the first insulating pad 4 is disposed in the recess 2 and, for instance, encircle the through hole 3; in another example, the first insulating pad 4 may also comprise sections partially disposed at the edge of the through hole 3 as long as the supporting substrate 10 can be supported. The substrate 10 is disposed on the first insulating pad 4 in operation. As shown in FIG. 2A, the substrate 10 is disposed on the metal frame body 1, but in actual production, the substrate 10 may be disposed beneath the substrate fixing apparatus, and the evaporation source is disposed on the other side of the substrate fixing apparatus.

In an embodiment of the present disclosure, the recess 2 is formed on the metal frame body 1 along the periphery of the through hole 3, so that the recess 2 can bear the substrate to be coated within a space limited by the metal frame body 1. As the substrate is not tightly attached to the space, specific gaps tend to be formed between bonded positions of the substrate and the recess 2. In this way, an ITO film material tends to fall into the gaps in the evaporation process, and hence the abnormal discharge phenomenon can be caused due to the conduction between the ITO film coated on the substrate and the metal frame body 1 through the film materials in the gaps.

In order to avoid the above technical problem, a first insulating pad 4 in a form of ring for example is disposed at the bottom of the recess 2 on a plane parallel to the metal frame body 1. In this way, even the ITO film material falls into the gaps between the substrate and the recess 2, the substrate and the metal frame body 1 will not be electrically conducted with each other, and hence the abnormal discharge phenomenon cannot be caused. Therefore, the substrate and the metal frame body 1 can be completely isolated to achieve the insulation and improve the coating effect. In addition, as the first insulating pad is disposed at the bottom of the recess, the abrasion to the recess, which caused by the friction due to the direct contact between the substrate and the recess, can also be avoided. Therefore, the above technical problem can be solved by only replacing the first insulating pad without the overall replacement of the substrate fixing apparatus, and hence the operation cost can be greatly reduced.

In order to allow the first insulating pad attached to the recess 2 to effectively eliminate the gaps between the substrate and the recess 2, in at least one embodiment of the present disclosure, the first insulating pad has a consistent dimension all along on a plane parallel to the metal frame body 1, and the dimension of the first insulating pad is consistent with that of the recess 2. In this way, the case that the coating effect of the area to be coated of the substrate is affected by the overlarge dimension of the first insulating pad can be well avoided. During coating a film on the substrate, an evaporation material is provided from an opposite side of the substrate through the through hole 3. If the dimension is overlarge, the material that should be coated on the area to be coated of the substrate will be partially retained on the first insulating pad. If the dimension is too small, gap spaces will still be formed between the substrate and the recess 2, which can result in the abnormal discharge phenomenon due to the conduction between the substrate and the metal frame body 1 through the ITO film material in the gaps between the substrate and the recess 2.

In at least one embodiment of the present disclosure, the dimension of the first insulating pad is 6-10 mm all along on the plane parallel to the metal frame body 1. The dimension of the first insulating pad all along is set to be within the above range, which means that the dimension of the recess 2 on the metal frame body 1 may be 6-10 mm. By adoption of the configuration, on one hand, the recess 2 can effectively bear the substrate when the substrate is placed onto the recess 2; and on the other hand, the coating effect of the area to be coated of the substrate cannot be affected.

Figure 2B:
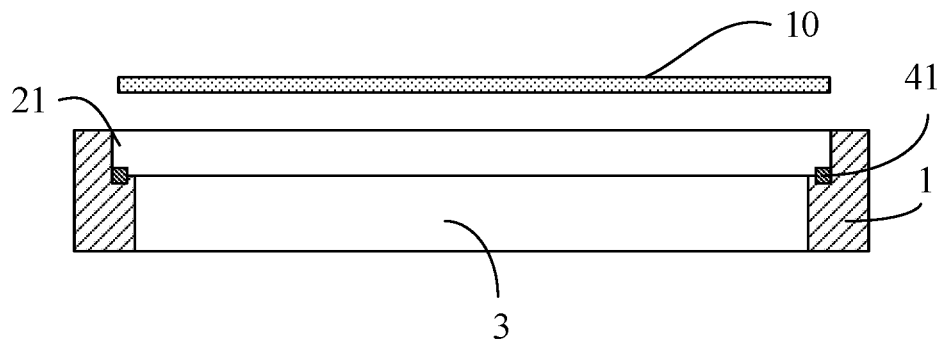
FIG. 2B is a schematic sectional view of another example of the substrate fixing apparatus provided by the embodiment.

FIG. 2B is a schematic sectional view of another example of the substrate fixing apparatus provided by the embodiment. As shown in the figure, compared with the example as shown in FIG. 2A, the stepped recess 21 along the periphery of the through hole 3 is further provided with a concaved portion, and a first insulating pad 41 is embedded into the concaved portion but is still projected out of the step surface to support the substrate 10. The method can better maintain the first insulating pad 41.

Figure 3:
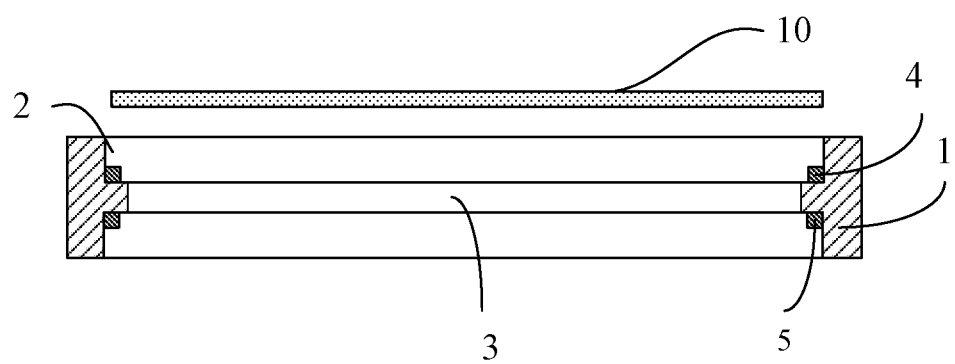
FIG. 3 is a schematic sectional view of one example of a substrate fixing apparatus provided by another embodiment of the present disclosure.

In the substrate fixing apparatus provided by another embodiment of the present disclosure, a second insulating pad may further be disposed on an inner wall of the through hole 3. FIG. 3 is a schematic sectional view of an example of the substrate fixing apparatus provided by the embodiment. As shown in FIG. 3, compared with the embodiment as shown in FIG. 2A, another stepped recess is also formed along the edge/periphery of the through hole 3 on the other side of the metal frame body 1 opposite to the recess 2, and a second insulating pad 5 is disposed in the recess in a form of ring for example. By adoption of the second insulating pad 5, the unexpected conduction phenomenon caused by the fact that the film materials falling into the gaps between the substrate and the recess 2 are excessive and distributed on the inner wall of the through hole 3 can be further effectively avoided.

In order to have stable performances when the first insulating pad attached to the bottom of the recess 2 and/or further the second insulating pad 5 attached to the bottom of another recess of the through hole 3 are sent into an equipment for coating, both the first insulating pad and the second insulating pad are insulating pads can bear the heat-resisting temperature of 300 to 600° C. In at least one embodiment of the present disclosure, both the first insulating pad and the second insulating pad are insulating pads with the heat-resisting temperature of 400 to 550° C. Considering that the above temperature range is closer to the temperature for coating the ITO film on the surface of the substrate in the equipment, the selection of the insulating pads within the temperature range is more favorable to obtain stable performances of the insulating pads under the high-temperature condition of the device.

In at least one embodiment, both the first insulating pad and the second insulating pad may be insulating pads made from a material or materials comprising amide repeating units. As the materials provided with the amide repeating units generally have high-temperature resistant insulation properties; thus, the material provided with such a kind of structural units can be used for the insulating pads in the embodiment. In selecting a plurality of materials provided with amide repeating units respectively to produce the insulating pads which are then used in the coating process, the inventor has found that: polyimide material is the most suitable in the production no matter in the sense of material properties or cost. It should be understood that: when the material suitable for the insulating pad is selected by those skilled in the art, the material is not limited to the compounds of the above structural units and may adopt any material having the above properties.

Figure 4:
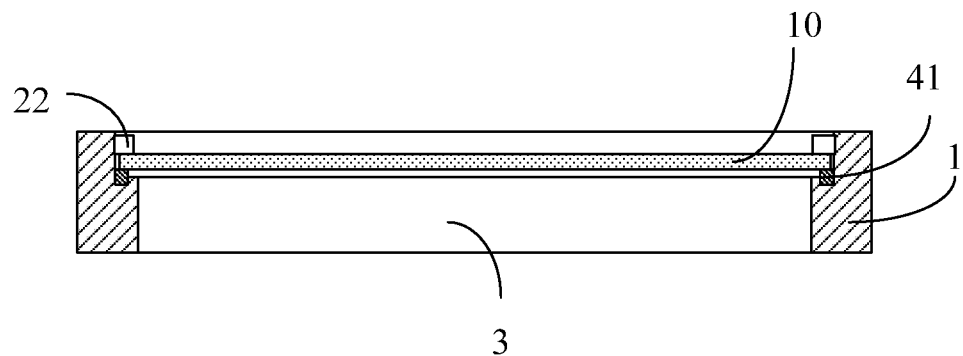
FIG. 4 is a schematic sectional view of one example of a substrate fixing apparatus provided by still another embodiment of the present disclosure.

In at least one embodiment of the present disclosure, the metal frame body 1 is a titanium alloy metal frame, for example; in another example, the metal frame body 1 is provided with clips for holding the substrate along the circumference of a side wall of the recess 2. As shown in FIG. 4, compared with the example as shown in FIG. 2B (the present disclosure is not limited thereto), when the substrate 10 is disposed on the first insulating pad 4 in the recess 2, the substrate 10 is fixed on the metal frame body 1 by clips 22. When a titanium alloy metal frame is selected, on one hand, the titanium alloy metal frame has good abrasion resistance; and on the other hand, the titanium alloy metal frame will not be deformed under the high-temperature condition when been transferred into the device. In addition, when the titanium alloy metal frame is provided with the clips for holding the substrate along the circumference of the side wall of the recess 2, on one hand, the substrate can be steadily held in the metal frame and will not be shifted during the coating process; and on the other hand, when the metal frame body 1 is of any shape, e.g., circular, rectangular or diamond-shaped, and even is of an irregular shape, the substrate fixed thereon can be firmly fixed. In at least one embodiment of the present disclosure, the titanium alloy metal frame is a homocentric square titanium alloy metal frame, and each side of four sides of the homocentric square titanium alloy metal frame may be provided with 6 clips for stably fixing the substrate. It should be understood that the number of the clips on each side is not particularly limited as long as the clips have the fixing function.

At least one embodiment of the present disclosure further provides a vertical coating device, which comprises the substrate fixing apparatus provided by any foregoing embodiment which is used in cooperation with the vertical coating device. When the substrate fixing apparatus provided by the present disclosure is used with the vertical coating device, the abnormal discharge phenomenon due to the conduction between the substrate and the metal frame body as the film materials coated on the substrate fall into the gaps between the substrate and the recess can be effectively avoided, and hence the effective operation of the coating process can be guaranteed.

The substrate fixing apparatus provided by at least one embodiment not only can be applied in the substrate coating process in an embodiment of the present disclosure but also can be widely applied in the coating process in the vertical coating device. In addition, the substrate applicable for the substrate fixing apparatus for coating has no specific limit in specification, may be a large-size substrate, and may also be a small-size substrate. The specific specification of the substrate is not particularly limited in the present disclosure and may be selected by those skilled in the art according to the requirements during the actual production.

At least one embodiment of the present disclosure provides a substrate fixing apparatus, which comprises the metal frame body and the through hole formed in a central portion of the metal frame body and consistent with the area to be coated of the substrate. The recess for bearing the substrate is also formed on the metal frame body along the edge of the through hole. As the first insulating pad is provided at the bottom of the recess, the abnormal discharge phenomenon due to the conduction between the substrate and the metal frame body as the ITO film material falls into the gaps between the substrate and the recess when attached to each other during the evaporation can be avoided, and hence the substrate and the metal frame body can be completely isolated to achieve insulation and improve the coating effect. In addition, because the first insulating pad is formed at the bottom of the recess, the recess abrasion caused by the friction due to the direct contact between the substrate and the recess can also be avoided. Therefore, the above technical problems can be solved by only replacing the first insulating pad without the overall replacement of the substrate fixing apparatus, and hence the operation cost can be greatly reduced.

The foregoing is only the preferred embodiments of the present disclosure and not intended to limit the scope of protection of the present disclosure. The scope of protection of the present disclosure should be defined by the appended claims.

The present application claims priority to the Chinese patent application No. 201510142563.9, filed Mar. 27, 2015, the disclosure of which is incorporated herein by reference as part of the application.

What is claimed is:

1. A substrate fixing apparatus, comprising a metal frame body,
    wherein a central portion of the metal frame body is provided with a through hole;
    a recess configured for bearing a substrate is formed on the metal frame body along an edge of the through hole;
    the recess is recessed towards an inside of the metal frame body along a thickness direction of the metal frame body;
    a first insulating pad is disposed at the bottom of the recess; and
    a second insulating pad is disposed on the first insulating pad.

2. The substrate fixing apparatus according to claim 1, wherein the first insulating pad has a uniform dimension on a plane parallel to the metal frame body; and a dimension of the first insulating pad is equal to that of the recess.

3. The substrate fixing apparatus according to claim 2, wherein the dimension of the first insulating pad is 6-10 mm on the plane parallel to the metal frame body.

4. The substrate fixing apparatus according to claim 1, wherein the second insulating pad is disposed on an inner wall of the through hole.

5. The substrate fixing apparatus according to claim 4, wherein both the first insulating pad and the second insulating pad are insulating pads with a heat-resisting temperature of 300 to 600° C.

6. The substrate fixing apparatus according to claim 4, wherein both the first insulating pad and the second insulating pad are insulating pads made of a material provided with amide repeating units.

7. The substrate fixing apparatus according to claim 6, wherein both the first insulating pad and the second insulating pad are polyimide insulating pads.

8. The substrate fixing apparatus according to claim 1, wherein the metal frame body is a titanium alloy metal frame.

9. The substrate fixing apparatus according to claim 1, wherein clips for holding the substrate are provided on the metal frame body along a side wall of the recess.

10. A vertical coating device, comprising the substrate fixing apparatus according to claim 1 which is configured for cooperation with the vertical coating device.

\* \* \* \* \*